(12) United States Patent
Wrycraft

(10) Patent No.: US 7,215,556 B2
(45) Date of Patent: May 8, 2007

(54) RACK-MOUNTABLE SYSTEMS

(75) Inventor: Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/495,327

(22) PCT Filed: Nov. 7, 2002

(86) PCT No.: PCT/GB02/05010

§ 371 (c)(1),
(2), (4) Date: Feb. 17, 2005

(87) PCT Pub. No.: WO03/041470

PCT Pub. Date: May 15, 2003

(65) Prior Publication Data

US 2005/0117316 A1    Jun. 2, 2005

(30) Foreign Application Priority Data

Nov. 8, 2001    (GB) .................................. 0126882.0

(51) Int. Cl.
*H05K 7/14* (2006.01)
(52) U.S. Cl. .................... 361/802; 361/756; 361/741; 361/754; 361/798; 439/377
(58) Field of Classification Search ............... 361/796, 361/726, 732, 740, 741, 747, 756, 759, 801, 361/802; 439/377, 260, 259, 267
See application file for complete search history.

(56) References Cited

U.S. PATENT DOCUMENTS 5,460,441 A * 10/1995 Hastings et al. ............ 312/298

(Continued)

OTHER PUBLICATIONS

International search report application No. PCT/GB02/05010 mailed Apr. 7, 2003.

(Continued)

*Primary Examiner*—Dean A. Reichard
*Assistant Examiner*—Dameon E. Levi
(74) *Attorney, Agent, or Firm*—Meyertons Hood Kivlin Kowert & Goetzel, P.C.; B. Noël Kivlin

(57) ABSTRACT

A rack-mounted assembly (10) comprises one or more racks, each capable of containing one or more printed circuit boards (PCB) (18), interconnected by a backplane (15) which is located along the bottom of a shelf (14). This position of the backplane (15) allows the rear wall of the rack-mounted assembly to be perforated, thereby permitting a cooling airflow for the PCBs to pass in through the front of the assembly and then out through the back. An insertion mechanism is provided to allow a PCB to be inserted into a rack. To achieve this, the PCB must first travel backwards into the rack-mounted assembly, and then downwards into engagement with the backplane (15). In one embodiment, this is accomplished by supporting the PCB from a hanger (100) which moves in and out of the rack-mounted assembly along a guide rail (45). The hanger includes slots (115) that retain pins (110) from the PCB. The slots are orientated diagonally upwards and backwards. A compression spring (60) is also provided to urge the pins (and hence PCB) forwards. Upon insertion, the hanger moves along guide rail (45) until the PCB abuts a stop (50). At this point further insertion of the hanger forces the pins (110) to move along slots (115) in opposition to spring (60), thereby driving the PCB down into engagement with the backplane (15).

17 Claims, 6 Drawing Sheets

U.S. PATENT DOCUMENTS

| | | | |
|---|---|---|---|
| 5,657,204 A * | 8/1997 | Hunt | 361/752 |
| 5,815,377 A * | 9/1998 | Lund et al. | 361/802 |
| 5,868,585 A * | 2/1999 | Barthel et al. | 439/377 |
| 5,967,824 A * | 10/1999 | Neal et al. | 439/342 |
| 6,033,254 A * | 3/2000 | Neal et al. | 439/377 |
| 6,053,760 A * | 4/2000 | Bailis et al. | 439/377 |
| 6,071,143 A * | 6/2000 | Barthel et al. | 439/377 |
| 6,373,712 B1 * | 4/2002 | Bailis et al. | 361/756 |
| 6,597,581 B2 * | 7/2003 | Barringer et al. | 361/756 |
| 6,606,255 B2 * | 8/2003 | Barringer et al. | 361/807 |
| 6,667,890 B1 * | 12/2003 | Barringer et al. | 361/752 |
| 6,709,276 B2 * | 3/2004 | Barringer et al. | 439/64 |
| 6,976,859 B2 * | 12/2005 | Blackwell | 439/157 |

OTHER PUBLICATIONS

Combined Search and Examination Report regarding application No. GB 0126882.0 mailed Jul. 10, 2002.

* cited by examiner

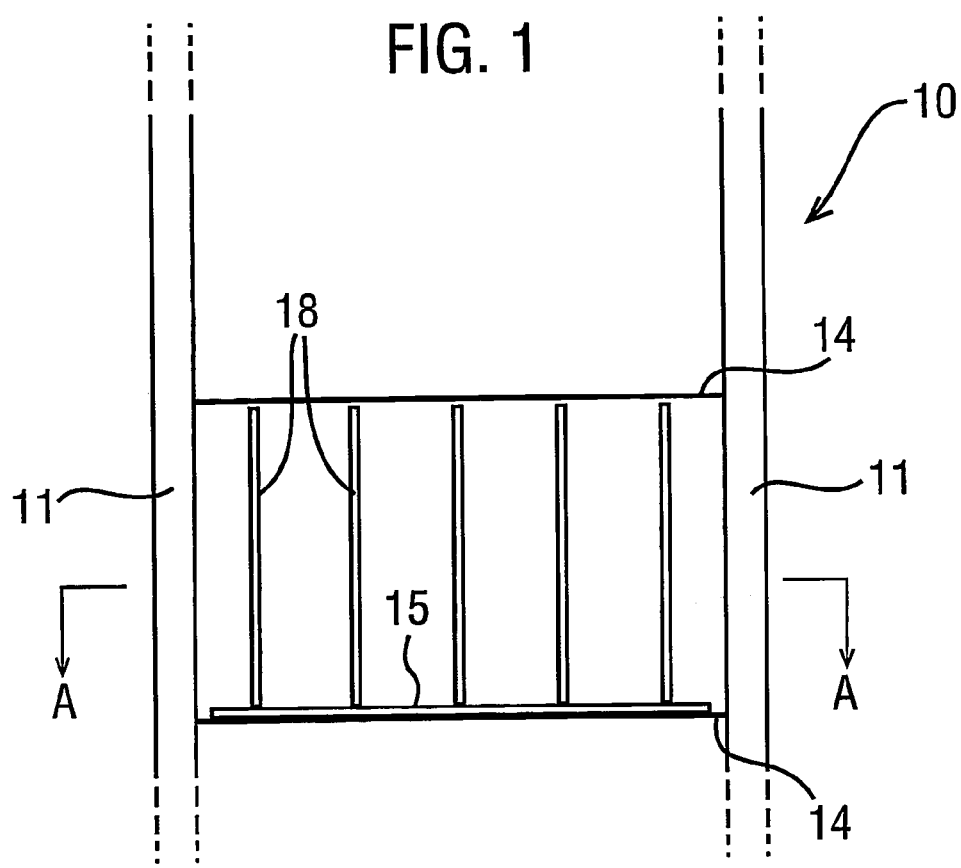
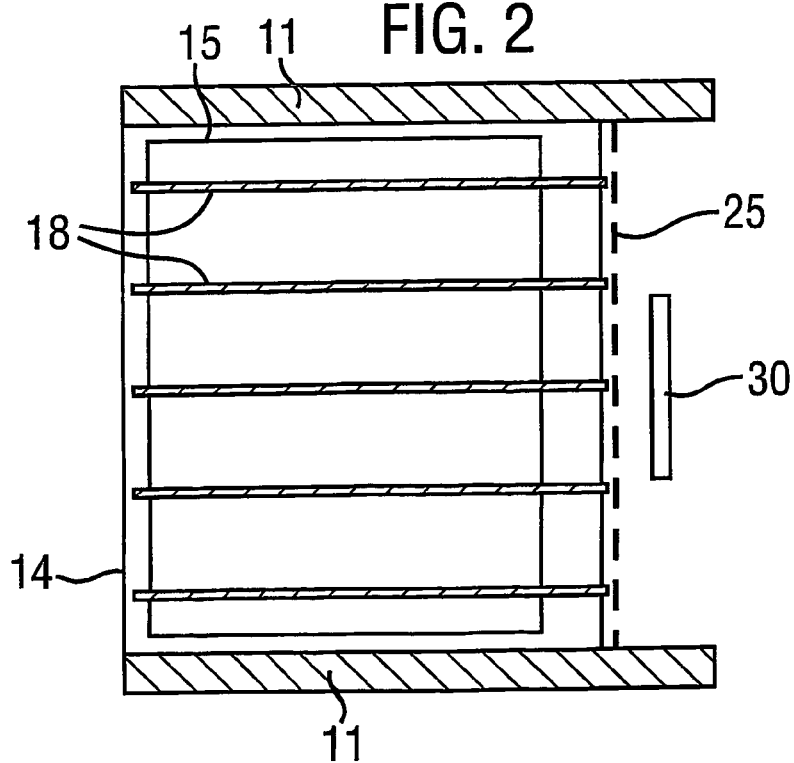

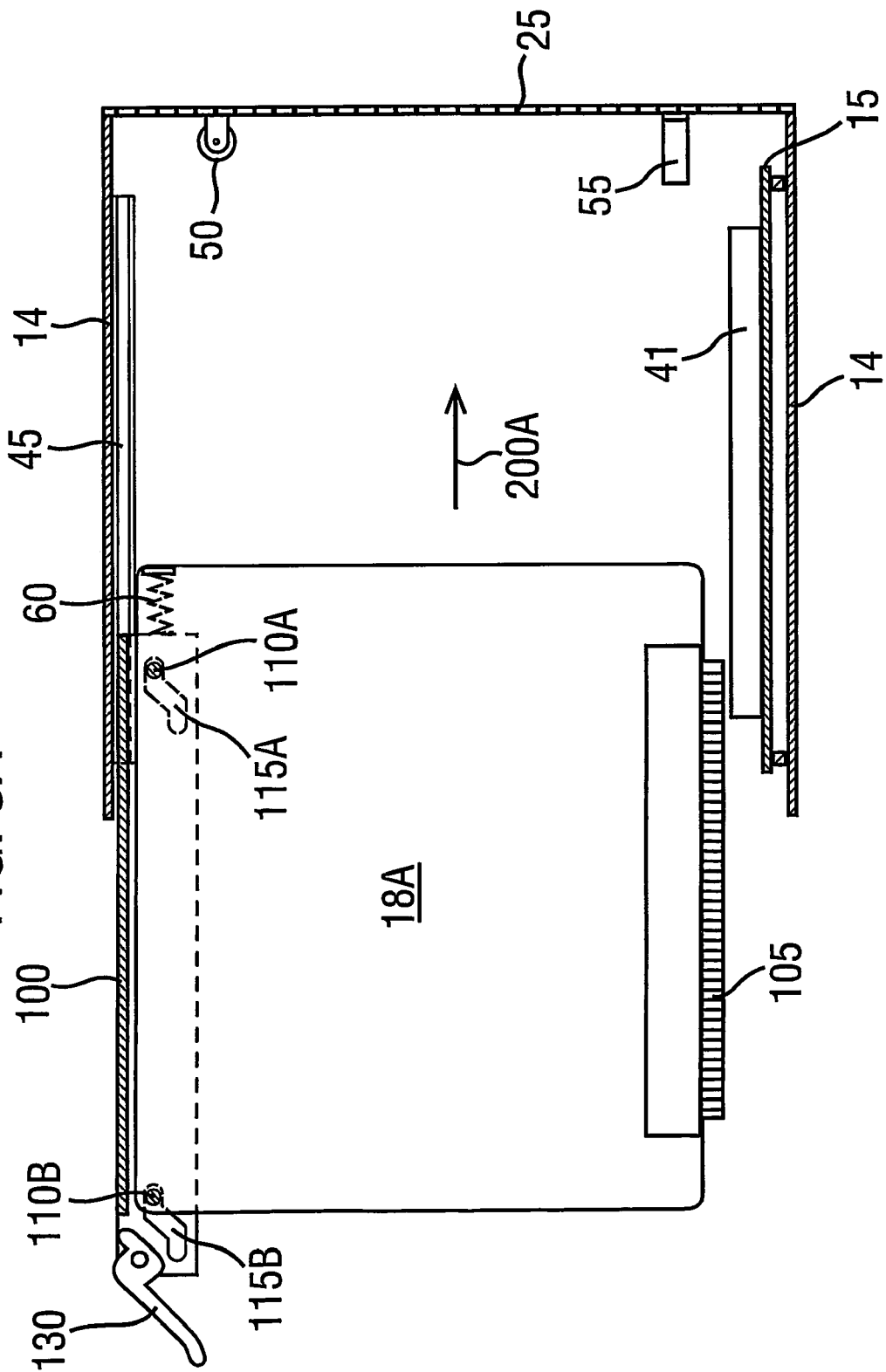

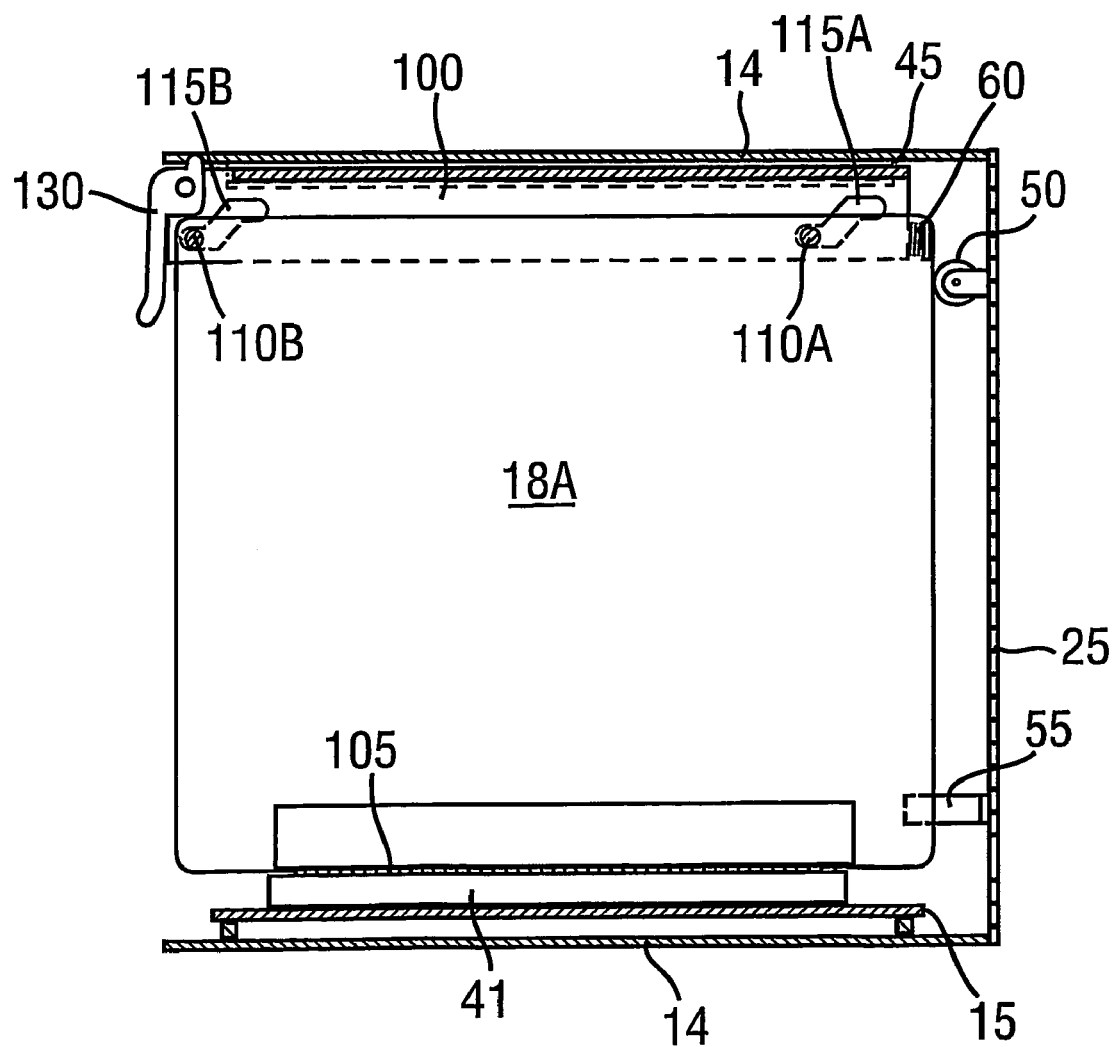

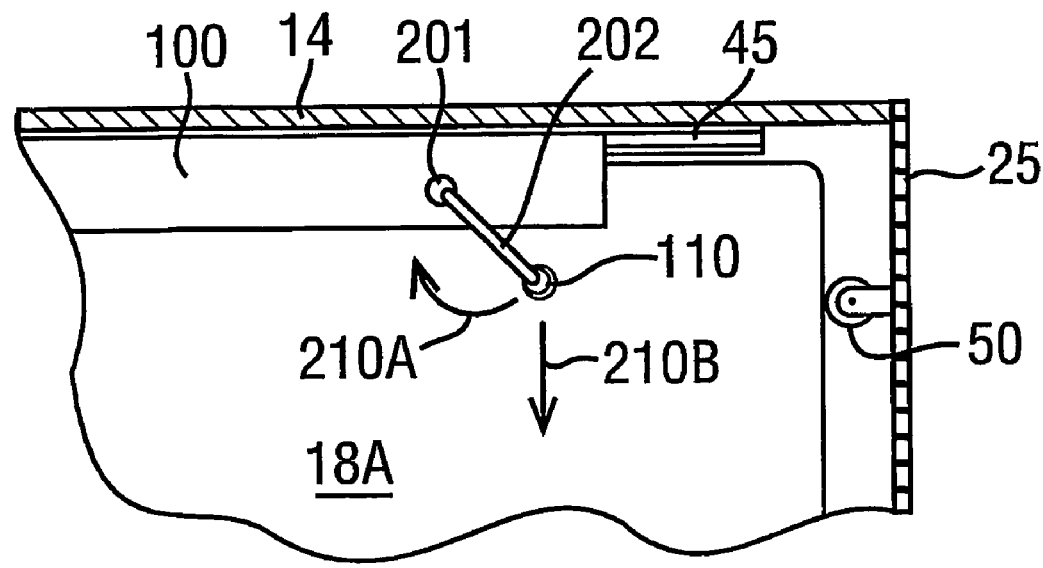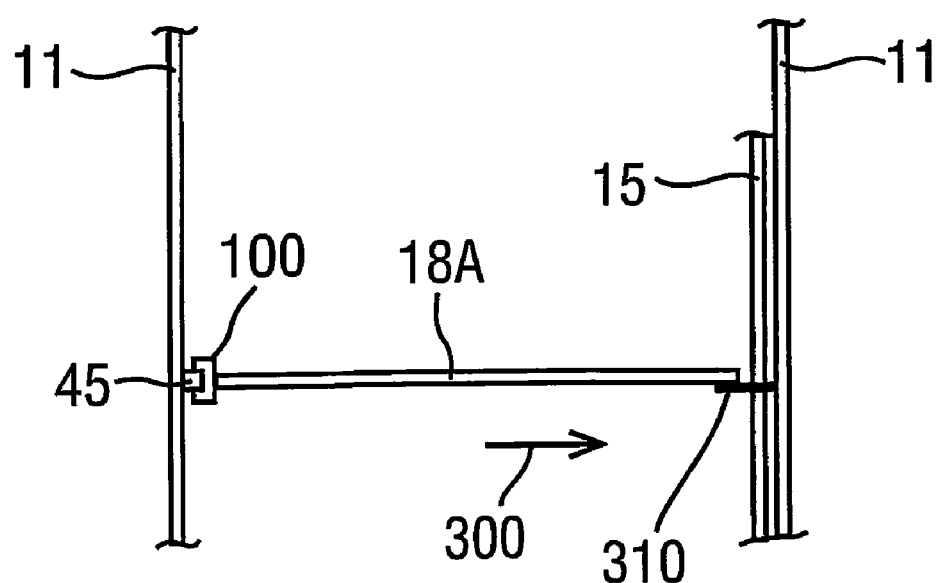

RACK-MOUNTABLE SYSTEMS

FIELD OF THE INVENTION

The present invention relates to rack-mountable systems, and in particular to the mounting of a card within such a system.

BACKGROUND OF THE INVENTION

There is an ongoing demand to provide higher and higher performance for electronic systems, for example computer systems, within racking. Often there is an increase in the heat generated by equipment as the performance of the equipment increases. In order to provide effective cooling, it is necessary to provide paths whereby cooling air can be passed over heat generating components and then be removed from the equipment. In a rack mounted system, it is generally desirable to draw cool air in from the front of the racking and to expel the air warmed by the heat generating components from the rear of the racking.

One common way of providing high performance in a scalable manner is to provide a backplane (e.g. a motherboard) with a plurality of connectors for receiving subsystems (e.g. daughterboards). The various subsystems mounted on the backplane will generally interact with the other subsystems mounted on the backplane to enable a complete system of a the desired performance to be implemented. The mounted subsystems can represent different components of the complete system, or alternatively two or more of the subsystems could be the same as each other.

A problem arises of how to configure such systems while still providing for adequate cooling. Typically, for convenience, rack-mountable components are mounted from the front of the racking, and the backplane is located at the back of the racking. Consequently, as a subsystem is fully inserted into the racking, the connectors on the subsystem will naturally engage the corresponding connectors on the backplane.

As indicated above, it is normally desirable for the cooling air to be drawn from the front of the racking and to be expelled from the rear of the racking. However, when the backplane is placed at the rear of the racking, this blocks the simple route for the cooling air from the front to the rear of the racking. This results in having to provide more complex paths for the cooling air, which can reduce the cooling efficiency and also increase noise. It is therefore desirable to be able to improve the configuration of rack-mountable systems in such a manner that better accommodates effective and efficient cooling.

SUMMARY OF THE INVENTION

Accordingly, the present invention provides a rack-mounted assembly comprising one or more racks, each capable of containing one or more electronic card subsystems interconnected by a motherboard, and an insertion mechanism for allowing a card subsystem to be inserted into a rack, said insertion mechanism constraining a card subsystem on insertion to travel initially in a first direction substantially parallel to the motherboard and subsequently in a second direction substantially perpendicular to the motherboard and into electronic engagement therewith.

In most implementations of the rack-mounted assembly, the motherboard has a horizontal orientation along the base of a rack, the first direction is from the front towards the rear of the rack and said second direction is vertically downwards. Such an arrangement supports a cooling airflow that passes through the back of the assembly, since this is not obstructed by a backplane located at the rear of the assembly, as in prior art devices. In one embodiment, the back of the assembly is perforated to allow the passage of a cooling airflow through it, and a ventilator, for example a fan, is provided to move air through the assembly from front to back, although the fan could alternatively be separate from the assembly.

In one particular embodiment, the insertion mechanism includes a movable carriage for supporting the card subsystem being inserted into the rack. The carriage is constrained to move in and out of the rack along a track that extends in said first direction, and includes a fixture for attaching the card subsystem to the carriage (typically two points of attachment are provided). The fixture includes a translation mechanism that converts motion of the carriage in the first direction into motion of the card subsystem in the second direction. This is achieved by the fixture including at least one track (e.g. a slot) that receives an engagement device (e.g. a pin) on the card subsystem, and allows the engagement device to travel along the track. The track extends obliquely in relation to both the first and the second directions. Consequently, as the track moves towards the rear of the rack, it also moves away from the motherboard. A spring is provided that serves to elastically bias the card subsystem against motion in the second direction. A latch is also provided that locks the card subsystem into position once it has engaged the backplane. This locking may occur automatically, or be subject to some predetermined user action. Note that in order to remove the card subsystem from the assembly, the latch must be released, resulting in ejection of the subsystem by the spring.

In one particular embodiment of the invention there is also a stop to prevent further motion of the card subsystem in the first direction, once it has travelled far enough towards the back of the assembly for engagement with the motherboard. The stop comprises a roller that permits movement of the card subsystem in the second direction, and is mounted onto the rear wall of the assembly. In this embodiment, the rear wall also supports a guide to assist in correct alignment of the card subsystem with the motherboard.

The invention further provides a carriage adapted for use with such a rack assembly. Note that such a carriage may be permanently fixed to the rack assembly, or it may be detachable, to allow easier insertion of a card subsystem into the carriage.

The invention further provides a rack-mounted assembly comprising one or more racks, at least one rack containing at least one electronic card subsystem in electronic engagement with a motherboard located on the side or floor of a rack, and adapted to support a cooling airflow passing through the back of the rack.

In one embodiment, there is an ejector mechanism to remove the electronic card subsystem according to a two-stage motion. In a first stage the card subsystem moves in a direction perpendicular to the motherboard, whilst in a second stage it moves outwards towards the front of the rack. This two-stage motion helps to ensure that the card subsystem disengages from the motherboard without damage to their respective electrical connectors.

The invention further provides a method of mounting an electronic card subsystem into a rack-mounted assembly comprising one or more racks, each capable of containing one or more electronic card subsystems interconnected by a motherboard, said method comprising the steps of:

inserting the card subsystem in a first direction substantially parallel to the motherboard;

and subsequently constraining the card subsystem to travel in a second direction substantially perpendicular to the motherboard and into electronic engagement therewith.

In summary, in one particular embodiment, a rack-mounted assembly comprises one or more racks, each capable of containing one or more printed circuit boards (PCB), interconnected by a motherboard which is located along the bottom of a shelf. This position of the motherboard allows the rear wall of the rack-mounted assembly to be perforated, thereby permitting a cooling airflow for the PCBs to pass in through the front of the assembly and then out through the back. An insertion mechanism is provided to allow a PCB to be inserted into a rack from the front. To achieve this, the PCB must first travel into the rack-mounted assembly in a direction towards the rear of the rack, and then downwards into engagement with the motherboard. In this particular embodiment, this is accomplished by supporting the PCB from a hanger which moves in and out of the rack-mounted assembly along a guide rail. The hanger includes slots that retain pins from the PCB. The slots are orientated diagonally upwards and backwards. A compression spring is also provided to urge the pins (and hence PCB) forwards relative to the hanger. Upon insertion, the hanger moves along the guide rail, carrying the PCB, until the PCB abuts a stop. At this point further insertion of the hanger forces the pins to move along the slots in opposition to the spring, thereby driving the PCB down into engagement with the motherboard.

BRIEF DESCRIPTION OF THE DRAWINGS

Various embodiments of the invention will now be described in detail by way of example only with reference to the following drawings, in which the same reference numerals are used for like components in different diagrams. In the drawings:

FIG. 1 illustrates the primary components of an example of a rack-mounted system in accordance with the present invention;

FIG. 2 depicts a horizontal section through the rack-mounted system of FIG. 1 along line A—A.

FIGS. 3A, 3B and 3C illustrate in more detail the insertion of a card into the rack-mounted system of FIG. 1;

FIG. 6 shows an alternative form of the mechanism for driving the card into its final operating position in the rack-mounted system of FIG. 1; and FIG. 7 shows a front view of an alternative embodiment of a rack-mounted system in accordance with the present invention, in which the cards for insertion into the system are to be mounted horizontally.

DETAILED DESCRIPTION

Figure 3B:
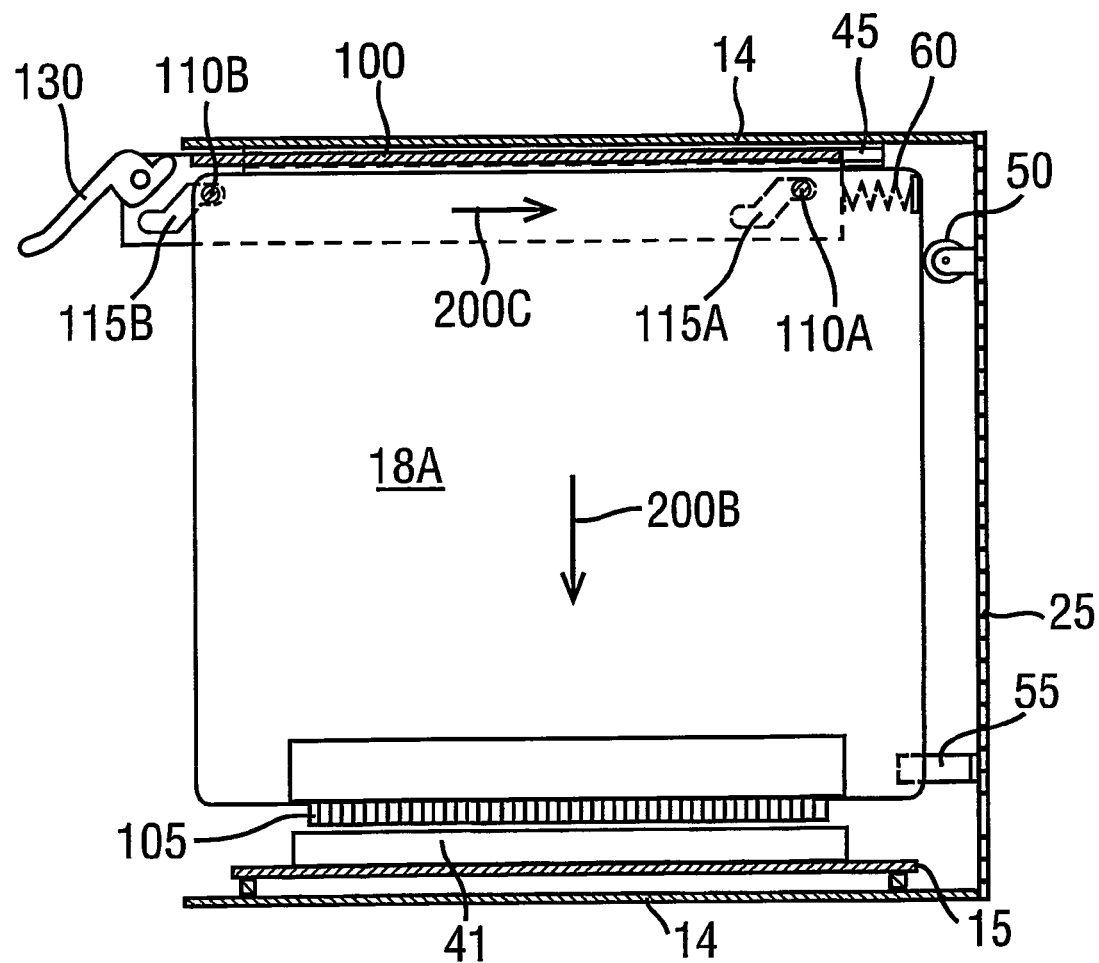

FIG. 1 illustrates in schematic form the front view of a rack-mounted computer system 10 representing one embodiment of the present invention, in which multiple shelves (or racks) 14 are supported in-between side walls 11. Within each shelf are multiple cards or printed circuit boards (PCBs) 18 that provide computing functionality in accordance with the particular components on the PCB (not shown). These are typically located in predetermined positions on a shelf known as slots. Note that the PCBs within one shelf do not necessarily all provide the same function; similarly the different shelves within system 10 may (and indeed commonly do) vary in purpose and configuration.

At the base of PCBs 18 is another card 15, which generally provides a bus or other communications facility to interconnect the PCBs 18 on a shelf. Card 15 may include its own processing capability, and may in some implementations also effectively provide the physical structure for shelf 14. In the configuration of FIG. 1, card 15 is referred to as the motherboard, with PCBs 18 then being described as daughterboards.

It will be appreciated that whilst FIG. 1 illustrates only two shelves, and PCBs for only one of these, a rack-mounted system will normally have multiple shelves, each containing its own set of PCBs.

FIG. 2 depicts a section through the rack-mounted system of FIG. 1 along line A—A. This illustrates the side walls 11, motherboard 15, shelf 14, and PCBs 18, as described above in relation to FIG. 1. Note that shelf unit 14 is illustrated as extending under essentially the full length of PCBs 18, but a wide variety of other structures are possible, providing PCBs 18 (and card 15) can be properly supported and held securely in position. For example, shelf 14 could instead comprise a set of parallel bars extending between the side walls 11.

FIG. 2 also illustrates the back wall 25 of the rack-mounted computer system 25. This is shown by a dashed line to indicate that it is perforated, thereby allowing an airflow generated by a ventilator, in this case a fan, 30 to pass through it. This air flow is generally drawn in from the front of the rack, passing out through the back, and serves to cool the electronic components on PCBs 18 and motherboard 15.

FIG. 2 does not specifically depict details of the fixing of fan 30, but it will be appreciated that this may be of any suitable form. Alternatively fan 30 may in fact be a physically separate device from computer system 10, but positioned adjacent to it, or it is possible that fan 30 could be omitted altogether, if sufficient airflow for cooling purposes can be otherwise achieved (e.g. by natural circulation of air). In addition, whilst back wall 25 is perforated in this embodiment, to permit airflow through it whilst still providing support for certain components described below, any other suitable arrangement could be utilised. For example, back wall 25 could comprise a frame structure interfilled with wire meshing or such-like.

An important aspect of rack-mounted systems is that individual components, especially PCBs 18, are easily removable, without having to dismantle the entire system. Thus if a particular card becomes faulty, or it is desired to upgrade a card, the PCB can be extracted from system 10. This allows a component on the card to be replaced if faulty or in need of upgrading, after which the card can then be reinserted into system. Alternatively, it may be desirable to replace the entire PCB with a new PCB, or simply to augment the original installation by inserting one or more new PCBs into previously vacant slots, for example to provide additional memory or processing capability. Thus one must be able to easily insert cards into and remove cards from the rack-mounted system 10 without damage to the cards or to the other components of the system.

As previously mentioned, in prior art installations the motherboard 15 has typically been located at the rear of the daughterboards 18, in other words in the location occupied by back wall 25. In this arrangement it is relatively straightforward to engage a new daughterboard with the motherboard, in that the act of inserting the daughterboard into rack-mounted system 10 will naturally bring it into contact with the motherboard at the rear. However, as discussed above, such an arrangement suffers from thermal problems, in that it can be difficult to provide sufficient airflow past the PCBs if the back wall is a card, which effectively acts as a solid barrier to airflow.

This problem is ameliorated by the configuration show in FIG. 2, in that placing the motherboard underneath the PCBs 18 allows the back wall 25 to be at least partially open to airflow. On the other hand, care needs to be taken as regards the mechanism for inserting and removing PCBs 18. Thus since simply sliding a PCB along motherboard 15 into the shelf is liable to damage one or the other (or both) of the cards. There is then also a need to lower PCB 18 towards the motherboard 15 so that their connectors properly mate with one another.

In view of the above considerations, a mechanism is provided in accordance with the present invention that allows a card being inserted to reliably engage with a motherboard 15 that is substantially parallel to a rack shelf. The operation of this mechanism is illustrated in FIG. 3 (note that for clarity, the various components of the mechanism were omitted from FIGS. 1 and 2).

FIG. 3A illustrates the situation as a PCB 18A starts to be inserted into a slot in the rack-mounted system. The direction of insertion is indicated by arrow 200A. PCB 18A is supported from a hanger 100 by two pins 110A and 110B which engage slots 115A and 115B in the hanger. Note that the pins pass through the PCB to engage corresponding slots in the hanger on the other side of the PCB (not visible in FIG. 3A). Accordingly, relative movement between the hanger 100 and PCB 18A is constrained to that permitted by motion of pins 110 back and forth along slots 115.

The shape of slots 115 is generally in the form of a diagonal line rising from front to back (here back indicates the portion closest to the back wall of system 10. The slots also have two short horizontal portions, the first at the lowest (front) location, and the second at the highest (back) location. Note that pins 110 are positioned in this latter location whilst PCB 18A is being inserted into rack-mounted system 10.

The hanger 100 itself is supported by a guide rail 45, which in turn is attached to the underside of the shelf 14 immediately above the slot for PCB 18A. The rail 45 permits hanger 100 to slide in and out of the rack-mounted system, carrying PCB 18A. The hanger is further provided with an ejector mechanism 130, which has a locked and an unlocked position. At the start of insertion (as shown in FIG. 3A) the ejector mechanism is in its unlocked position.

The PCB module 18A includes a connector 105 which is intended to mate with a corresponding connector 41 on motherboard 15. Note that connector 105 must be inserted essentially vertically into connector 41, and so they cannot be allowed to engage with one another until PCB 18 is fully inserted into its slot.

Also shown in FIG. 3A are a roller stop 50 and an alignment guide 55, both attached to the back wall 55. The purpose of these is described in more detail later. In addition, mounted on PCB 18A is a compression spring 60, which abuts against hanger 100 (note that there may also be an equivalent second compression spring on the opposite side of PCB 18A, not visible in FIG. 3A).

At the start of insertion of PCB 18A, spring 60 is in its extended state, although it is still preferably slightly compressed. This then provides an expansion force pushing hanger 100 outwards, which has the effect of maintaining pins 110 at the back of slots 115 (i.e. to the right-hand end of the slots as depicted in FIG. 3A). This is because any motion of the pins forwards along the slots, which would require corresponding movement of the PCB 18A relative to hanger 100, is opposed by the resilience of the compression spring 60.

Pins 110 therefore remain in the position shown in FIG. 3A as the PCB 18A is inserted into rack-mounted system 10. This in turn holds the PCB in a fixed position relative to the hanger 100. Thus the back end of slots 110 prevents the pins 110 moving backwards relative to the hanger, whilst the compression spring prevents the pins from moving forwards relative to the hanger.

Turning now to FIG. 3B, this illustrates the situation after PCB 18A has been inserted to the back of its slot, but has not yet engaged with motherboard 15. At this juncture, the PCB 18A abuts against roller stop 50, which prevents movement of the card any deeper into the slot. Note that at this point the connector 105 on PCB 18A is correctly aligned above the corresponding connector 41 on the motherboard 15 (at least in terms of the direction of insertion). Thus in order for these two connectors to engage, it is necessary for the PCB 18A to move vertically downwards, in the direction shown by arrow 200B.

It will be appreciated that the connectors will not mate properly if they are offset from one another in a direction perpendicular to the plane of PCB 18A. Guide rail 45 is stationed vertically above connector 41, and will provide approximate positioning of PCB 18A. However, as PCB 18A is inserted, there may still be a little leeway at the bottom of the PCB 18A. Since this is where the connection is made to motherboard 15, this leeway must be reduced to acceptable limits; in other words, PCB 18A must be restrained to an essentially vertical plane.

In order to accomplish this, alignment guide 55 is provided. This guide defines a short channel, which in plan view is relatively broad at its entrance, and then narrows further back (towards back wall 25). Thus as PCB 18A is inserted into system 10, it initially is received into the broad channel entrance, even if it is slightly tilted from the vertical. However, as the PCB is pushed further inwards, its position is constrained by the narrowing channel, which guides the PCB 18A towards a properly vertical orientation. Finally, at the point of full insertion of FIG. 3B, alignment guide 55 ensures that PCB 18A is prevented from any movement in a direction perpendicular to PCB 18A that would endanger the correct mating of connectors 105 and 41.

Note that guide 55 can be regarded as optional, and may be omitted, relying on the user to maintain PCB 18A in the desired vertical plane. This is particularly feasible if the design of rail 45 and hanger 100 is such that they already tend to hold the PCB in the correct position over the motherboard 15.

Returning to the operation of pins 110 and slots 115, these now serve to provide a cam mechanism to force PCB 18A downwards and into engagement with motherboard 15. Thus FIG. 3B represents a transition phase, where further horizontal motion of the hanger 100 into the rack-mounted system 10 in the direction of arrow 200C cannot push the card 18A any further into system 10, in view of stop 50.

Consequently, pushing hanger 100 further inwards from the position shown in FIG. 3B results in relative motion between the hanger and PCB 18A. In particular, compression spring 60 starts to be resiliently compacted, and pins 110 begin to move forwards and downwards along slots 115. This in turn forces the PCB 18A to move downwards with respect to the hanger 100, in other words towards the motherboard 15. It will be appreciated that the fall in slots 115 corresponds to the vertical distance that connector 105 must travel in order to correctly engage with connector 41.

Note that from a user perspective, an increasingly harder insertion force on the hanger 100 will be needed as the PCB 18A moves downwards onto motherboard 15, in order to overcome the restoring force of compression spring 60 as it becomes more and more compacted. This provides useful sensory feedback that insertion is nearly complete. In addition, the increasing resistance of the spring will tend to slow down motion of the PCB 18A. This in turn allows mating of the two connectors 45, 105 to be performed in a more careful and controlled manner, thereby minimising the risk of any damage to them.

The vertical motion of PCB 18A onto motherboard 15 is facilitated by the fact that stop 50 is provided as a roller. In particular, as the PCB moves downwards, this can be accommodated by simple rotation of roller 50, without the need for any relative slippage between PCB 18A and the surface of the roller. This is beneficial, in that the PCB 18A is being pushed onto the surface of the roller, effectively with the compression force of the spring (which will become increasingly greater as PCB 18A is brought into engagement with motherboard 15). The provision of a roller as stop 50 therefore avoids the possibility of friction-induced damage or wear on PCB 18A or stop 50 that might otherwise occur as PCB 18A is lowered onto motherboard 15.

It will be appreciated that guide 55 is also designed to allow PCB 18A into engagement of motherboard 15. In other words, guide 55 constrains PCB 18A from tilting out of the vertical, but allows it to move up and down within a vertical plane.

Looking now at FIG. 3C, this illustrates the configuration once insertion of PCB 18A has been completed, with connector 105 on PCB 18A now properly engaged with connector 41 on motherboard 15. Pins 110 are now located at the most forward (and lowest) positions of slots 115, which effectively prevents any further insertion of hanger 100. Note that this frontmost portion of the slot is again horizontal, which has the effect of preventing any motion upwards of PCB 18A; in other words PCB 18A is maintained firmly in contact with motherboard 15.

As shown in FIG. 3C, once the PCB 18A is fully inserted into its shelf in the rack-mounted system 100, ejector 130 is rotated into its locked position. The precise details of the locking mechanism are not important, and can be provided by any suitable mechanical implementation, such as a bolt, a clasp, some form of detent, or any other known latching structure. Note that operation of the mechanism could require specific user action, or it could be made to occur automatically once the hanger has been inserted past a certain point.

The purpose of ejector mechanism 130 is to oppose the force of compression spring 60, which would otherwise push hanger 100 out from system 100. Thus ejector mechanism effectively locks PCB 18A into its operational position on shelf 14, whereupon it is now ready for use within rack-mounted system 10.

Note that ejector mechanism 130 may also be arranged to provide leverage to exert additional force for moving PCB 18A into its final engagement position. This lever action may useful since at this point it is necessary to overcome essentially the full expansion force of compression spring 60. On the other hand, even in FIG. 3C, it is desirable that spring 60 is not fully compressed. This is to ensure that inward motion of the hanger 100 is limited by the end of slots 115, which can be controlled relatively precisely, rather than having a completely compressed spring 60 acting as a stop. In other words, it is important that pins 110 travel fully along slots 115 in order to provide the correct degree of vertical travel for proper engagement of connectors 41, 105. Allowing for manufacturing tolerances, this in turn makes it desirable that spring 60 can compressed at least a little bit further from the position shown in FIG. 3C.

In view of the above, it will be appreciated that removal of the PCB 18A from shelf 14 can be easily and quickly accomplished by simply unlocking ejector mechanism 130 (in other words by rotating it back to the unlocked position of FIGS. 3A and 3B). This allows compression spring 60 to expand, which in turn drives the hanger out of the shelf, partially away from PCB 18A. Consequently, pins 110 are now driven backwards along slots 115, and at the same time upwards due to the diagonal contour of the slots. This provides a cam action to raise the PCB 18A vertically from motherboard 15, and to disconnect connector 105 from connector 41. As before, this motion is assisted by roller 50, while undue tilt of PCB 18A is prevented by guide 55.

Once pins 110 have been driven by spring 60 to the back of slots 115, we have again reached the position shown in FIG. 3B. PCB 18A has now fully disengaged from motherboard 15, and connector 105 is clear of connector 41. Further withdrawal of the hanger from shelf 14 now leads to removal of PCB 18A itself. In particular, as the hanger 110 is retracted, the backmost edges of slots 115 now pull pins 110, and with them PCB 18A, out of rack-mounted system 10. This leads to the situation shown in FIG. 1A and beyond, where the PCB 18A becomes completely clear of shelf 14.

It will be appreciated that pins 110 are removable, to allow PCB 18A to be detached from hanger 100 for repair or replacement as desired. The skilled person will be aware of various possible designs of the pins to permit disengagement of PCB 18A from hanger 100. For example, the pins may be in the shape of the dumb-bell, in which one end of the dumb-bell can be removed (e.g. by unscrewing), to allow the central connecting rod to be inserted through or withdrawn from PCB 18A. Alternatively, the pins may be simply cylindrical in shape, but with a central thread that engages the PCB.

Figure 4:
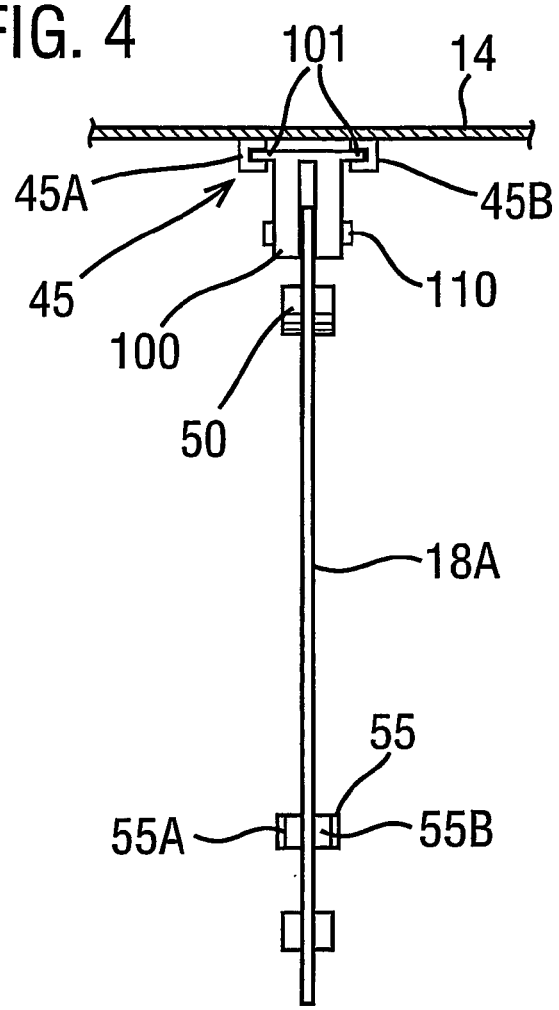
FIG. 4 illustrates in more detail the suspension of a card from a shelf of the rack-mounted system of FIG. 1.

FIG. 4 provides an edge-on view of PCB 18A, to illustrate in more detail the connection to hanger 100 and shelf 14 (it will be appreciated that for clarity this diagram omits certain other components of the rack-mounted system 10, such as motherboard 15, and connectors 105 and 41). In particular, we can see pin 110 extending through hanger 100 and PCB 18A to link them together. As mentioned above, some appropriate mechanism is provided to allow pin 110 to be withdrawn from the position shown, thereby permitting separation of PCB 18A from hanger 100 if desired.

Also shown in FIG. 4 are roller 50 and alignment guide 55. As regards the latter, two particular portions are indicated, 55A and 55B. The former portion 55A represents the relatively wide entrance at the front of the guide, for accommodating the PCB 18A even if it is slightly tilted. In contrast, portion 55B represents the taper backwards of the guide to a much narrower width. This serves to gradually constrain the PCB 18A into the correct vertical position as it is further inserted into the shelf.

Finally, FIG. 4 also illustrates the mechanism whereby hanger 100 is suspended from shelf 14 by guide 45. In particular, guide 45 comprises two rails 45, one 45A having a C-shaped cross-section and the other 45B having a reversed C-shaped cross-section. These two guide rails are set to face one another, and each receives and supports a transverse extension member 101 from hanger 100. It will be appreciated that this configuration allows hanger 100 to be slid in and out of rack-mounted system 10, whilst otherwise being retained in the correct position relative to shelf 14.

Figure 5A:
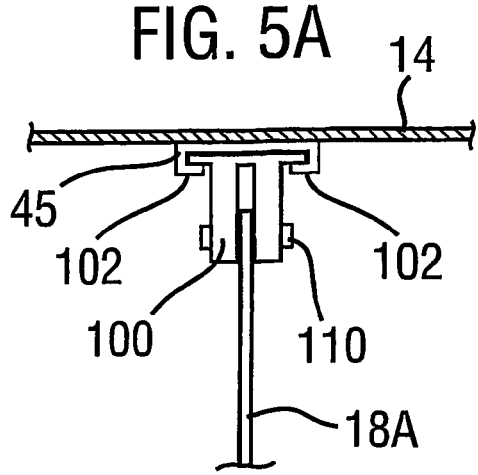
FIGS. 5A and 5B illustrate alternative forms for the suspension of a card from a shelf of the rack-mounted system of FIG. 1.
Figure 5B:
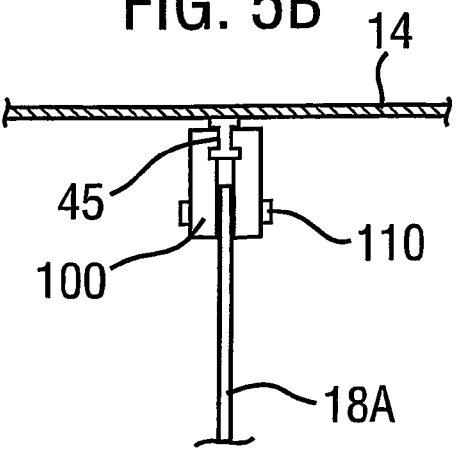

FIGS. 5A and 5B illustrate two alternative embodiments for the guide rail 45 and hanger 100 (omitting other detail). The arrangement of FIG. 5A is similar to that of FIG. 4, except that the top arms of the two C-shaped rails are now extended and joined together. The result of this is that guide 45 is now a single rail, effectively of C-shaped cross-section, where the C is facing downward. The two ends of the "C" then engage corresponding notches in the hanger 100. The arrangement of FIG. 5B is somewhat different, in that the guide rail 45 now has an I-shaped cross-section. The hanger 100 is consequently shaped into two arms that extend upwards either side of the I, and then hook into its central region. It will be recognised that the configurations shown FIG. 5A and FIG. 5B both allow hanger 100 to be supported from shelf 14, and at the same time to slide in and out of rack-mounted system 10.

Note that hanger 100 may be detachable from rack-mounted system 10 (i.e. by fully sliding out along rail 45), or some stop may be provided so that it only extends out far enough to allow the PCB module to be attached or removed. In this latter case, some further mechanism may be provided to permit full removal when especially desired (this would be analogous to similar mechanisms that are commonly found for example in desk or cupboard drawers).

Various particular embodiments of the invention have now been described in detail, but the skilled person will recognise that these are subject to many possible modifications. For example, compression spring 60 could be replaced by any device that provides a suitable resilience, for example some form of rubber grommet or such-like. In addition, whilst spring 60 has been described as attached to the PCB 18A and abutting hanger 100, it may also be attached to hanger 60, and contact a suitable abutment on PCB 18A. One possibility is for it to act directly against pin 110, urging it towards the backmost portion of slot 115.

Variations are also possible on the drive mechanism that forces the PCB module downwards once it has reached stop 50. One such example is shown in FIG. 6, which shows PCB module 18A at an equivalent stage of insertion to FIG. 3B. In this embodiment, the PCB 18A is again supported from hanger 100 by a pin 110. Attached to this pin 110 is a rigid arm 202, which is attached at the other end to a stud 201 on the hanger 100. Pin 110 and stud 201 are fixed in position (relative to the PCB 18A and hanger 100 respectively), but their connections to arm 202 permit the arm to rotate about them. In other words, both pin 100 and stud 201 can serve as an axis of rotation for arm 202. Arm 202 is elastically biased towards rotation in a counter-clockwise direction; this can be accomplished for example by a suitable fixing onto pin 100 or stud 201. This bias then serves in the same manner as spring 60 in FIG. 3, urging PCB module back against stop 50.

(Note that FIG. 6 shows only a single pin on one side of PCB 18A, but typically there will be two, each extending though PCB 18A, as described for previous embodiments).

Consider now the result in FIG. 6 of pushing hanger 100 further into the rack-mounted system 10. Since PCB 18A is already against stop 50, and guide rail 45 on shelf 14 prevents hanger 100 from rising, the outcome of this action is to rotate arm 202 clockwise in the direction of arrow 210A (i.e. against its bias). This in turn forces pin 110 downwards in the direction of arrow 210B, which results in PCB module 18A making the desired contact with the motherboard.

A somewhat different embodiment is illustrated in FIG. 7, in which PCB modules 18A (only one shown) are mounted horizontally between rack side walls 11. In this embodiment, the backplane or motherboard 15 is mounted parallel to one of the walls 11. It will be appreciated that for clarity many of the components shown for previous embodiments are omitted from FIG. 7 if their function is essentially as previously described (e.g. connectors 105 and 41).

In the embodiment of FIG. 7, when PCB module 18A is inserted into the system 10, it first goes backwards until it reaches the back of system 10, and then must move to the right (as shown by arrow 300 in FIG. 7), in order to engage motherboard 15. This two-stage motion can be provided in essentially the same manner as the two-stage motion described in relation to the other embodiments, providing the mechanism is suitably orientated. Thus in this case guide rail 45, which again supports hanger 100, extends along side wall 11. Other components are configured appropriately.

Note that in general the arrangement of FIG. 7 is less attractive than that of FIG. 3, because gravity becomes a hindrance rather than a help. Thus referring back briefly to FIG. 3, it will be seen that gravity helps to keep PCB 18A in the correct vertical orientation, and will also help it to fall into correct engagement with motherboard 15. In contrast, in the embodiment of FIG. 7, gravity will tend to tilt the PCB 18A out of the horizontal along the edge opposite to hanger 100 and guide rail 45. Such a tilt would make it difficult to connect properly with motherboard 15.

This problem is addressed at least partly by the provision of ledge 310 attached to the right-hand wall 11 of the rack system (the opposite wall to guide rail 45). Thus PCB 18A can rest on ledge 310 as it is inserted into the rack system, thereby keeping it horizontal. Note that it is desirable for ledge 310 and the portion of PCB 18A that contacts it to be provided with suitable surfaces for sliding over one another, thereby minimising any wear and tear during insertion and removal of PCB 18A.

It will be appreciated that a still further possible configuration is where the motherboard is attached to the lower surface of the shelf immediately above where the PCB is to be entered (in other words, effectively upside down in comparison with the arrangement of FIG. 3). In this situation, in order to complete insertion, the PCB must be moved upwards rather than downwards. This can be accomplished by having slots 115 run diagonally backwards and downwards, rather than diagonally backwards and upwards as shown in FIG. 3.

In conclusion, a range of particular embodiments has now been described, but the skilled person will recognise that these are exemplary only, and do not represent an exhaustive set. Thus the skilled person will be able to envisage many further modifications and alterations utilising the teachings set forth herein that remain within the scope of the claimed invention.

The invention claimed is:

1. A rack-mounted assembly comprising:
   one or more racks capable of containing one or more electronic card subsystems interconnected by a motherboard, and
   an insertion mechanism for allowing a card subsystem of the one or more card subsystems to be inserted into a rack of the one or more racks, said insertion mechanism constraining the card subsystem on insertion to travel in a first direction substantially parallel to a plane of the motherboard, and subsequently in a second direction substantially perpendicular to the plane of the motherboard and into electronic engagement therewith, wherein said insertion mechanism includes a carriage operable to move in and out of the rack along a track that extends in said first direction, and wherein the carriage is mounted to said card subsystem by a translation mechanism operable to convert motion of the carriage in said first direction relative to the card subsystem into motion of said card subsystem relative to the carriage in said second direction, and wherein the carriage further comprises an elastic biasing device that interacts with the card subsystem to elastically oppose motion of said carriage relative to said card subsystem in said first direction, the carriage further comprising a latch engageable with the rack to retain the carriage in its inserted position once the card subsystem has engaged with the motherboard.

2. The rack-mounted assembly of claim 1, wherein said carriage comprises at least one slot which slidably receives a pin on the card subsystem, wherein said slot extends obliquely in relation to both said first and said second directions, such that inserting movement of the carriage in the first direction relative to the card subsystem causes the card subsystem to move in the second direction.

3. The rack-mounted assembly of claim 1, wherein said carriage is attached to said card subsystem by a rotatable arm for attachment to the card subsystem.

4. The rack-mounted assembly of claim 1, wherein said carriage includes at least two points of attachment to the card subsystem.

5. The rack-mounted assembly of claim 1, wherein the rack further comprises a stop engageable with the card subsystem to prevent further motion of the card subsystem in said first direction, once it has traveled far enough into the rack for electronic engagement with the motherboard.

6. The rack-mounted assembly of claim 5, wherein said stop comprises a roller that permits movement of the card subsystem in said second direction.

7. The rack-mounted assembly of claim 5, wherein said stop is attached to a rear wall of the rack assembly.

8. The rack-mounted assembly of claim 1, further comprising a guide engageable with the card subsystem to ensure correct alignment of the card subsystem with the motherboard.

9. The rack-mounted assembly of claim 8, wherein said guide is attached to a rear wall of the rack assembly.

10. The rack-mounted assembly of claim 1, wherein the rear wall of the rack assembly is perforated to allow the passage of a cooling airflow through it.

11. The rack-mounted assembly of claim 10, further comprising a ventilator to move air through the assembly from front to back.

12. The rack-mounted assembly of claim 1, wherein the motherboard has a horizontal orientation along the base of a rack, and said second direction is vertically downwards.

13. A method of mounting an electronic card subsystem mounted to a carriage into a rack-mounted assembly comprising one or more racks capable of containing one or more electronic card subsystems interconnected by a motherboard, said method comprising:

inserting the card subsystem in a first direction substantially parallel to the motherboard by sliding engagement of the carriage with a track;

arresting movement of the card subsystem by engagement of the card with a stop;

subsequently constraining the card subsystem to travel in a second direction substantially perpendicular to the motherboard and into electronic engagement therewith by further movement of the carriage in said first direction against the action of a biasing spring which elastically opposes movement of the carriage in said first direction; and securing the carriage relative to the rack-mounted assembly by a latch.

14. The method of claim 13, wherein said second direction is vertically downwards.

15. The method of claim 13, wherein constraining the card subsystem to travel in the second direction comprises translating motion of the carriage in said first direction into motion of the card subsystem in the second direction.

16. The method of claim 13, wherein translating is performed by a pin on the card subsystem following an oblique slot formed in the carriage.

17. The method of claim 13 wherein translating is performed by a rotatable arm attached to the carriage and to the card subsystem, and extending obliquely relative to the first and second directions.

* * * * *